United States Patent
Matsumoto et al.

(10) Patent No.: US 11,632,885 B2
(45) Date of Patent: Apr. 18, 2023

(54) COMPONENT SUPPLY DEVICE

(71) Applicant: FUJI CORPORATION, Chiryu (JP)

(72) Inventors: Toru Matsumoto, Okazaki (JP); Tsuyoshi Hamane, Toyota (JP); Akio Sugihara, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 243 days.

(21) Appl. No.: 16/649,233

(22) PCT Filed: Sep. 22, 2017

(86) PCT No.: PCT/JP2017/034266
§ 371 (c)(1),
(2) Date: Mar. 20, 2020

(87) PCT Pub. No.: WO2019/058499
PCT Pub. Date: Mar. 28, 2019

(65) Prior Publication Data
US 2020/0305316 A1    Sep. 24, 2020

(51) Int. Cl.
*H05K 13/02* (2006.01)
*H05K 13/04* (2006.01)
*H05K 13/00* (2006.01)

(52) U.S. Cl.
CPC ....... *H05K 13/028* (2013.01); *H05K 13/0084* (2013.01); *H05K 13/0406* (2018.08); *H05K 13/0408* (2013.01)

(58) Field of Classification Search
CPC ............. H05K 13/028; H05K 13/0406; H05K 13/0408; H05K 13/0084
See application file for complete search history.

(56) References Cited

U.S. PATENT DOCUMENTS

2009/0241327 A1* 10/2009 Kashitani ........... H05K 13/0406
                                                                29/739
2016/0073514 A1*  3/2016 Watanabe .......... H05K 13/0408
                                                                29/741

FOREIGN PATENT DOCUMENTS

JP    2005-132577 A       5/2005
JP    2010215408 A   *   9/2010

OTHER PUBLICATIONS

Chen et al, "Component Placement Process Optimization for Multi-Head Surface Mounting Machine Based on Tabu Search and Improved Shuffled Frog-Leaping Algorithm", 2011 3rd International Workshop on Intelligent Systems and Applications, 2011, pp. 1-4. (Year: 2011).*

(Continued)

*Primary Examiner* — A. Dexter Tugbang
(74) *Attorney, Agent, or Firm* — Oblon, McClelland, Maier & Neustadt, L.L.P.

(57) ABSTRACT

A component supply device including a stage on which electronic components are scattered; a contacting section at a height so as to contact the electronic components on the stage; a slide device to relatively slide the stage and the contacting section; a dropping opening to allow the electronic components scattered on the stage caught by the contacting section to drop in accordance with the relative movement of the stage and the contacting section by the slide device; and a wall at a side opposite to a side of the dropping opening at which the electronic components scattered on the stage drop. The contacting section is provided to extend in a direction perpendicular to a sliding direction by the slide device, and at least a portion of the contacting section is inclined with respect to a straight direction along the sliding direction and an upper surface of the stage.

7 Claims, 17 Drawing Sheets

(56) References Cited

OTHER PUBLICATIONS

International Search Report dated Dec. 12, 2017 in PCT/JP2017/034266 filed on Sep. 22, 2017.

* cited by examiner

COMPONENT SUPPLY DEVICE

TECHNICAL FIELD

The present disclosure relates to a component supply device comprising a stage on which components are scattered.

BACKGROUND ART

There is a known component supply device that supplies components in a state scattered on a stage. With such a component supply device, there is a device that collects components by using a contacting section such a scraper and sliding at least one of the contacting section or the stage, such that components on the stage are dropped through a dropping opening. Further, as disclosed in the patent literature below, technology has been developed to use a contacting section such as a scraper to collect components on the stage at a specified location.

CITATION LIST

Patent Literature

Patent Literature 1: JP-A-2005-132577

BRIEF SUMMARY

Technical Problem

In the patent literature above, nothing is disclosed with regard to technology for dropping components on the stage through the dropping opening. It is an object of the present disclosure to favorably drop components on a stage through a dropping opening.

Solution to Problem

To solve the above problems, disclosed herein is a component supply device including: a stage configured such that electronic components are scattered on the stage; a contacting section provided at a height so as to contact the electronic components on the stage; a slide device configured to relatively slide the stage and the contacting section; a dropping opening configured to allow the electronic components scattered on the stage that have been caught by the contacting section to drop in accordance with the relative movement of the stage and the contacting section by the slide device; and a wall provided at a side opposite to a side of the dropping opening at which the electronic components scattered on the stage drop, wherein the contacting section is provided to extend in a direction perpendicular to a sliding direction by the slide device, and at least a portion of the contacting section is inclined with respect to a straight direction along the sliding direction and an upper surface of the stage.

Advantageous Effects

With the present disclosure, at least a portion of the contacting section is inclined with respect to a straight direction along the sliding direction of the stage and the contacting section. Accordingly, it is possible to push components in a direction perpendicular to the sliding direction, such that the components on the stage favorably drop into the dropping opening.

DESCRIPTION OF EMBODIMENTS

Figure 1:
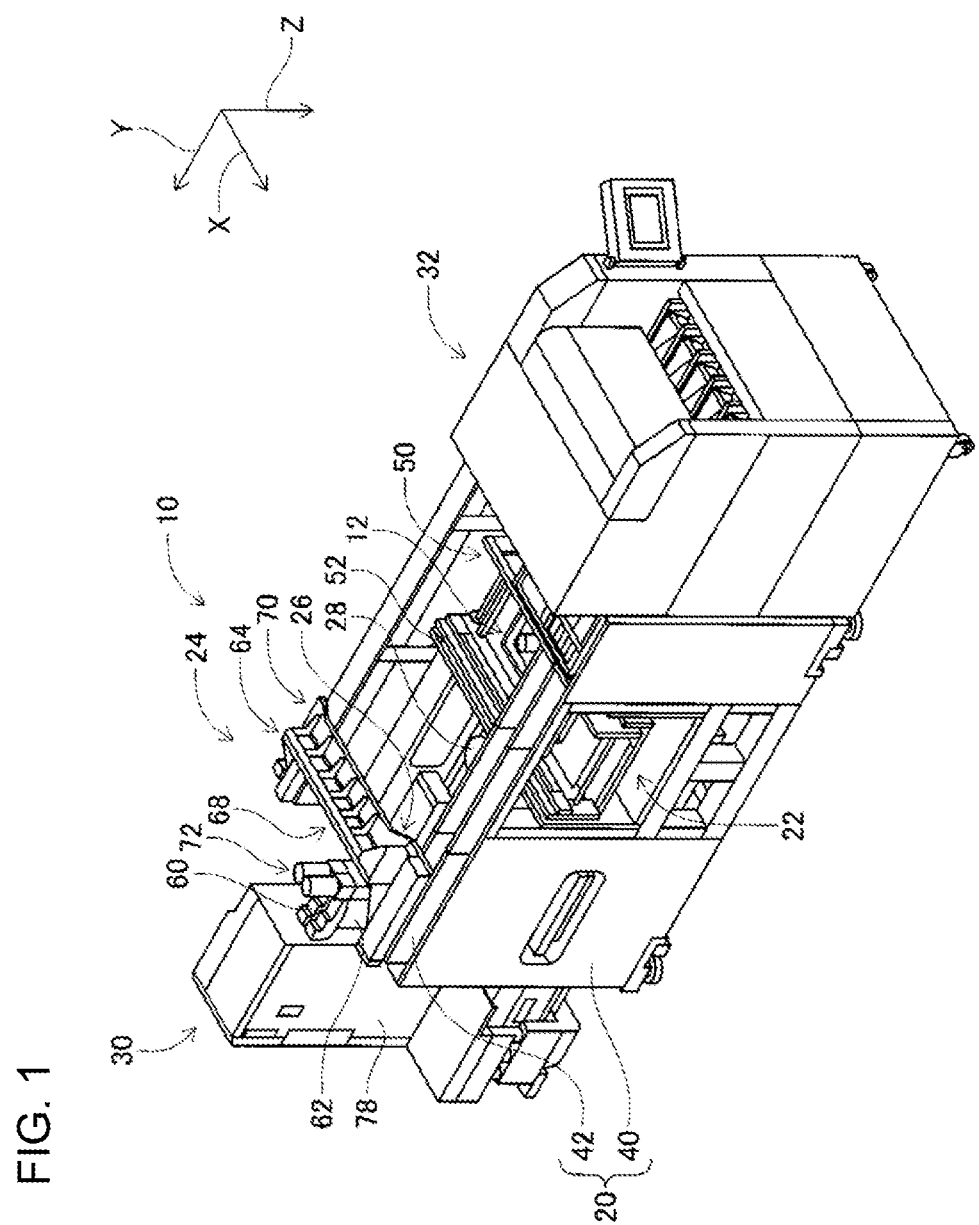
FIG. 1 is a perspective view of a component mounter.

The following describes in detail referring to the figures an example embodiment of the present disclosure.
(A) Configuration of Component Mounter FIG. 1 shows component mounter 10. Component mounter 10 performs work of mounting components on circuit board 12. Component mounter 10 is provided with device main body 20, board conveying and holding device 22, component mounting device 24, imaging devices 26 and 28, component supply device 30, loose component supply device 32, and control device 34 (refer to FIG. 11). Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
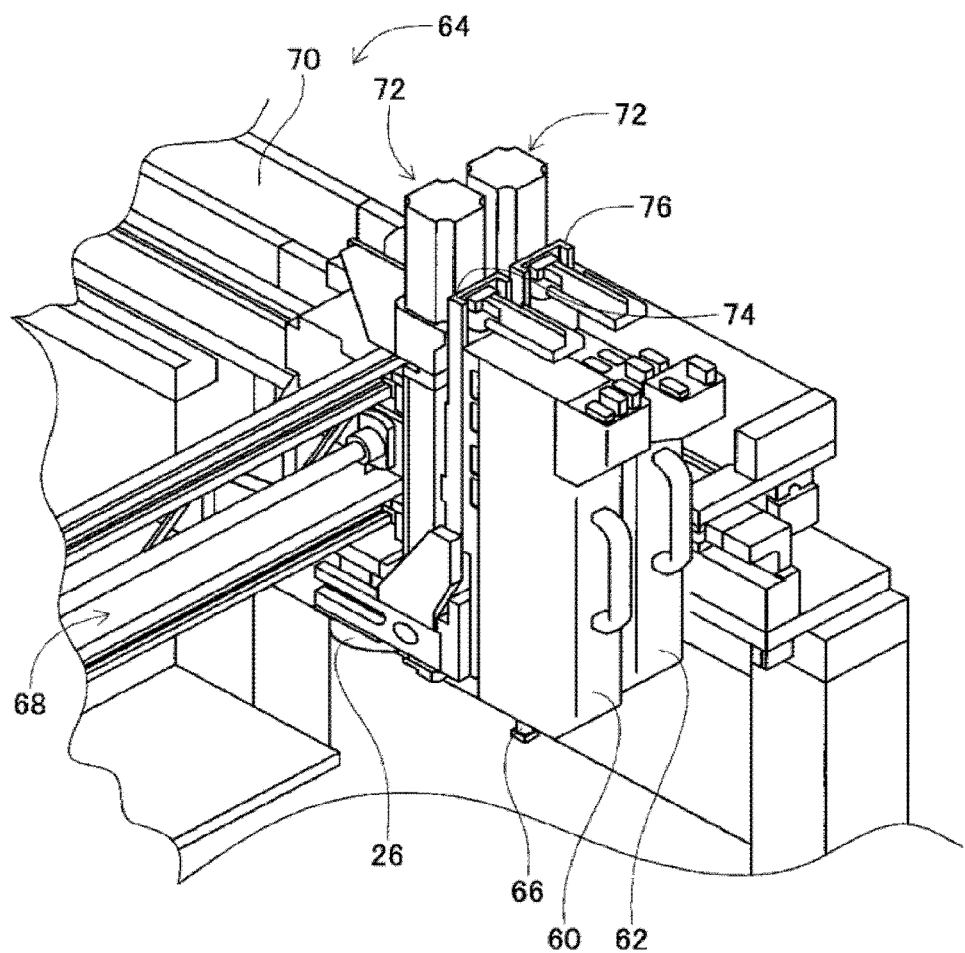
FIG. 2 is a perspective view of a component mounting device of the component mounter.

Component mounting device 24 is provided on beam section 42, and includes work heads 60 and 62 and work head moving device 64. Each work head 60 and 62 includes suction nozzle 66 (refer to FIG. 2) and holds a component using suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, as shown in FIG. 2, work head 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Imaging device 26 is attached to slide 74 in a state facing downwards, and is moved in the X direction, Y direction, and Z direction together with work head 60. Thus, imaging device 26 images any position on frame section 40. As shown in FIG. 1, imaging device 28 is provided in a state facing upwards on frame section 40 between board conveying and holding device 22 and component supply device 30. By this, imaging device 28 images a component held by suction nozzle 66 of work heads 60 and 62.

Component supply device 30 is provided at an end of frame section 40 in the front-rear direction. Component supply device 30 includes tray-type component supply device 78 and feeder-type component supply device (not shown). Tray-type component supply device 78 supplies components in a state arranged in a tray. The feeder-type component supply device supplies components via a tape feeder (not shown) or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. The configuration of component supply device 32 is described below in detail. Note that, components supplied by component supply device 30 and loose component supply device 32 may include electronic components such as electronic circuit components, configuration components of solar panels, configuration components of power modules, and the like. Also, electronic circuit components include components with leads and components without leads.

Figure 3:
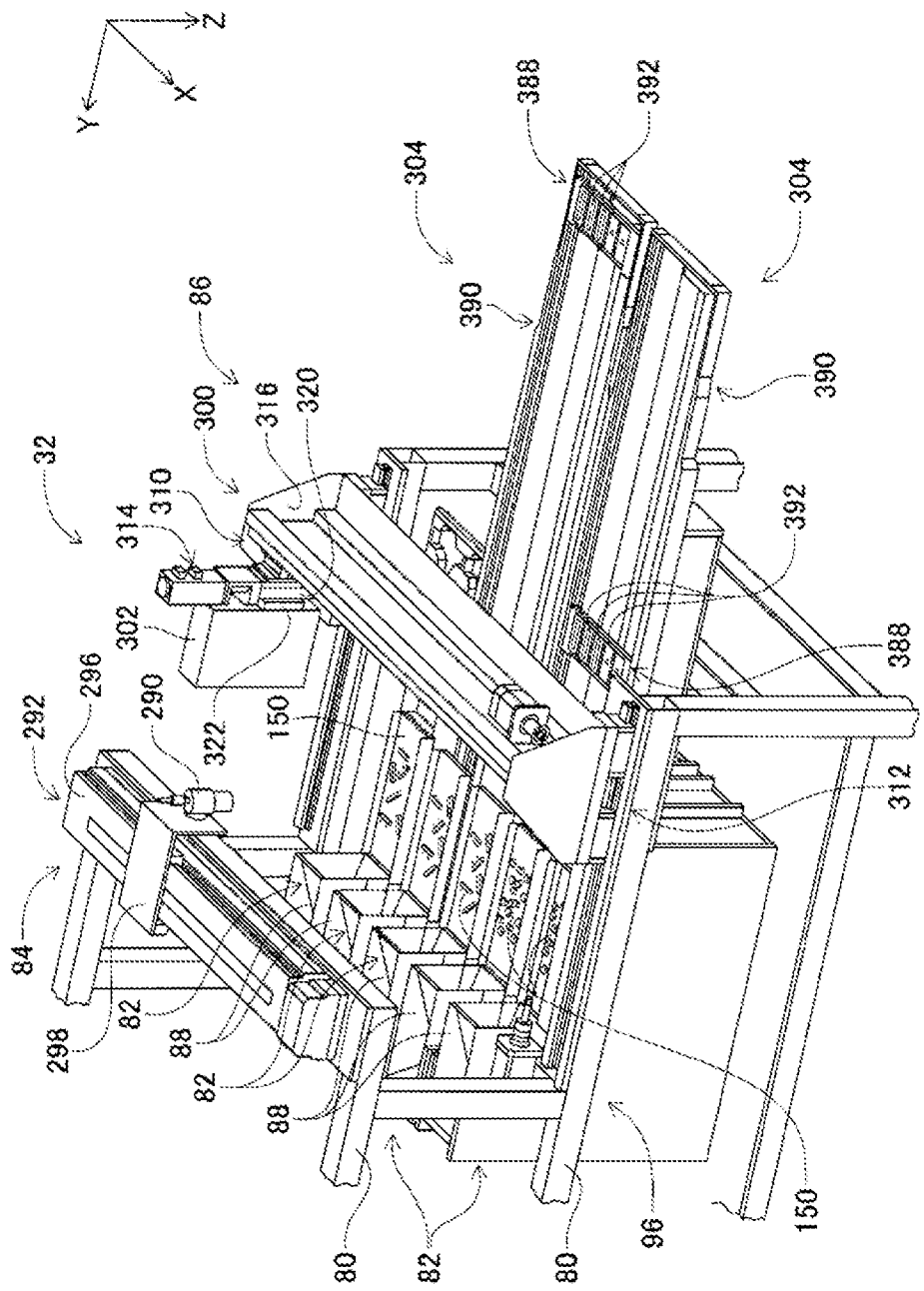
FIG. 3 is a perspective view of a loose component supply device.

As shown in FIG. 3, loose component supply device 32 includes main body 80, component supply unit 82, imaging device 84, and component transfer device 86.

(a) Component Supply Unit

Component supply unit 82 includes component supply apparatus 88, component scattering device 90 (refer to FIG. 4), and component returning device 92 (refer to FIG. 4), with component supply apparatus 88, component scattering device 90, and component returning device 92 being integrated into one unit. Component supply unit 82 is assembled to be removable from base 96 of main body 80, and with loose component supply device 32, five component supply units 82 are arranged in one row in the X direction.

Figure 4:
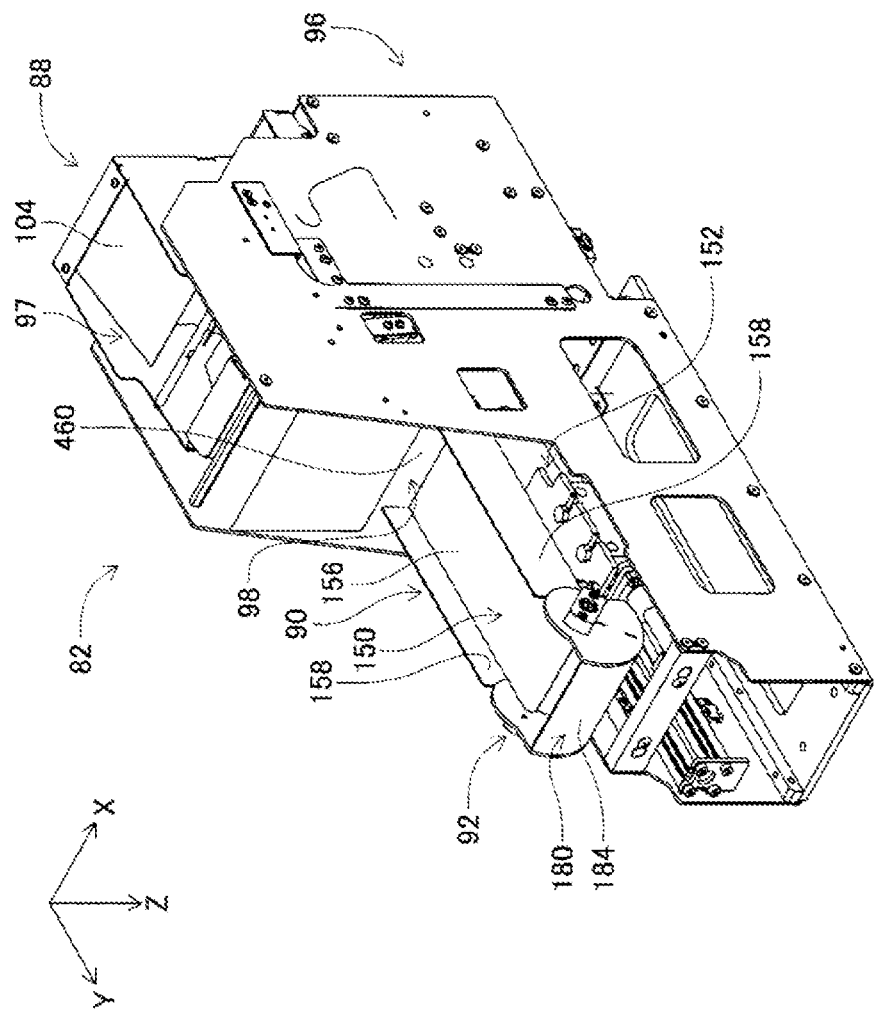
FIG. 4 is a perspective view of a component supply unit.
Figure 5:
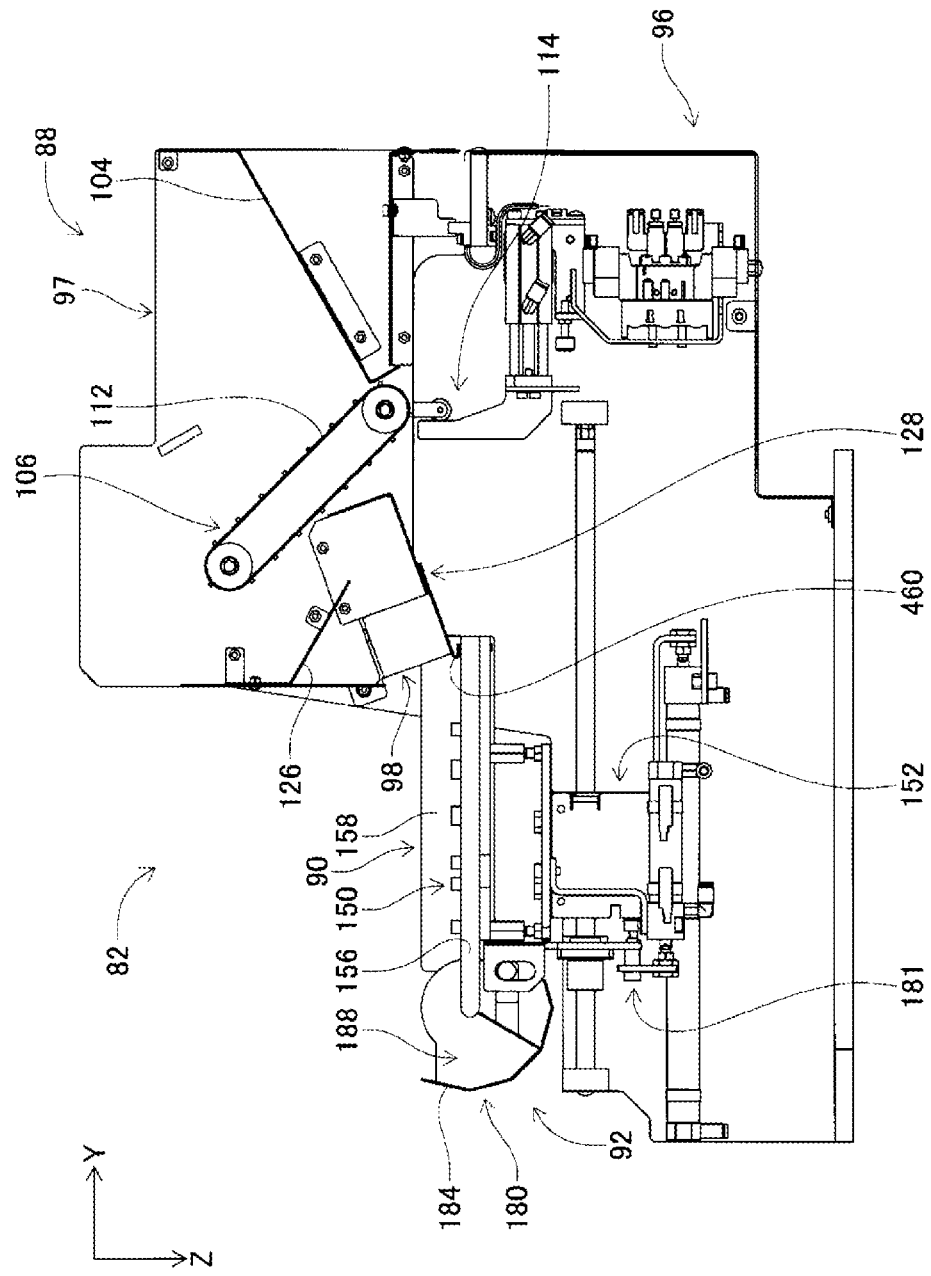
FIG. 5 is a transparent cross section view of the component supply unit.

As shown in FIGS. 4 and 5, component supply apparatus 88 is a substantially cuboid box arranged to extend in the Y direction. Note that, the Y direction is referred to as the front-rear direction of component supply apparatus 88, the direction toward the side on which component return device 92 is arranged in component supply unit 82 is referred to as the front, and the direction toward the side on which component supply apparatus 88 is arranged is referred to as the rear.

Component supply apparatus 88 has openings at the upper surface and front surface; the opening at the upper surface is component insertion opening 97 and the opening at the front surface is component discharge opening 98. With component supply apparatus 88, inclined plate 104 is provided below insertion opening 97. Inclined plate 104 is arranged so as to incline downward from the rear end surface of component supply apparatus 88 toward the center.

Also, as shown in FIG. 5, conveyor device 106 is arranged at the front side of inclined plate 104. Conveyor device 106 is arranged so as to be inclined upward from the front side end of inclined plate 104 toward the front of component supply apparatus 88. Note that, conveyor belt 112 of conveyor device 106 rotates counterclockwise in FIG. 5. In other words, the conveyance direction by conveyor device 106 is diagonally up from the front end of inclined plate 104.

Further, inclined plate 126 is arranged below the front end of conveyor device 106. Inclined plate 126 is arranged from the front end surface of component supply apparatus 88 toward the lower side of conveyor device 106, and the rear end portion is inclined downward. Further, inclined plate 128 is arranged below inclined plate 126. Inclined plate 128 is inclined such that the front end thereof is positioned downward from below the central portion of conveyor device 106 toward discharge opening 98 of component supply apparatus 88.

Component scattering device 90 includes component support member 150 and component support member moving device 152. Component support member 150 is configured from stage 156 and pair of side walls 158. Stage 156 is a roughly rectangular plate, and is provided to extend forwards from below component supply apparatus 88. Note that, the upper surface of stage 156 is substantially horizontal and, as shown in FIG. 5, is arranged with a small clearance gap from the bent front end of inclined plate 128 of component supply apparatus 88. Also, as shown in FIG. 4, pair of side walls 158 is fixed upright at both ends of stage 156 in the lengthwise direction.

Figure 11:
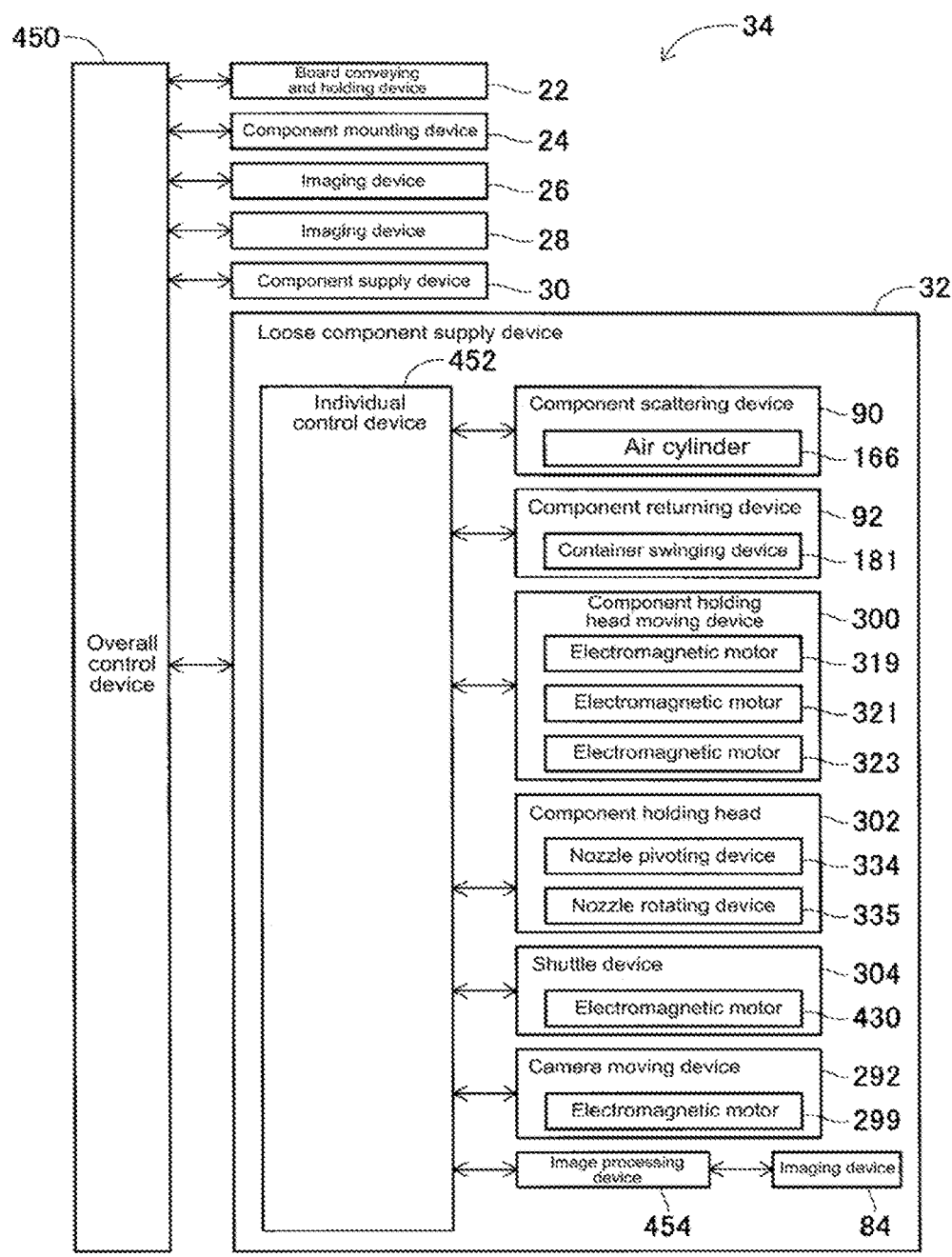
FIG. 11 is a block diagram showing a control device of the component mounter.

Further, component support member moving device 152 slides component support member 150 in the Y direction by operation of air cylinder 166 (see FIG. 11). Here, component support member 150 moves between a stored state (see FIG. 6) stored below component supply apparatus 88 and an exposed state (see FIG. 5) drawn out from under component supply apparatus 88.

Figure 7:
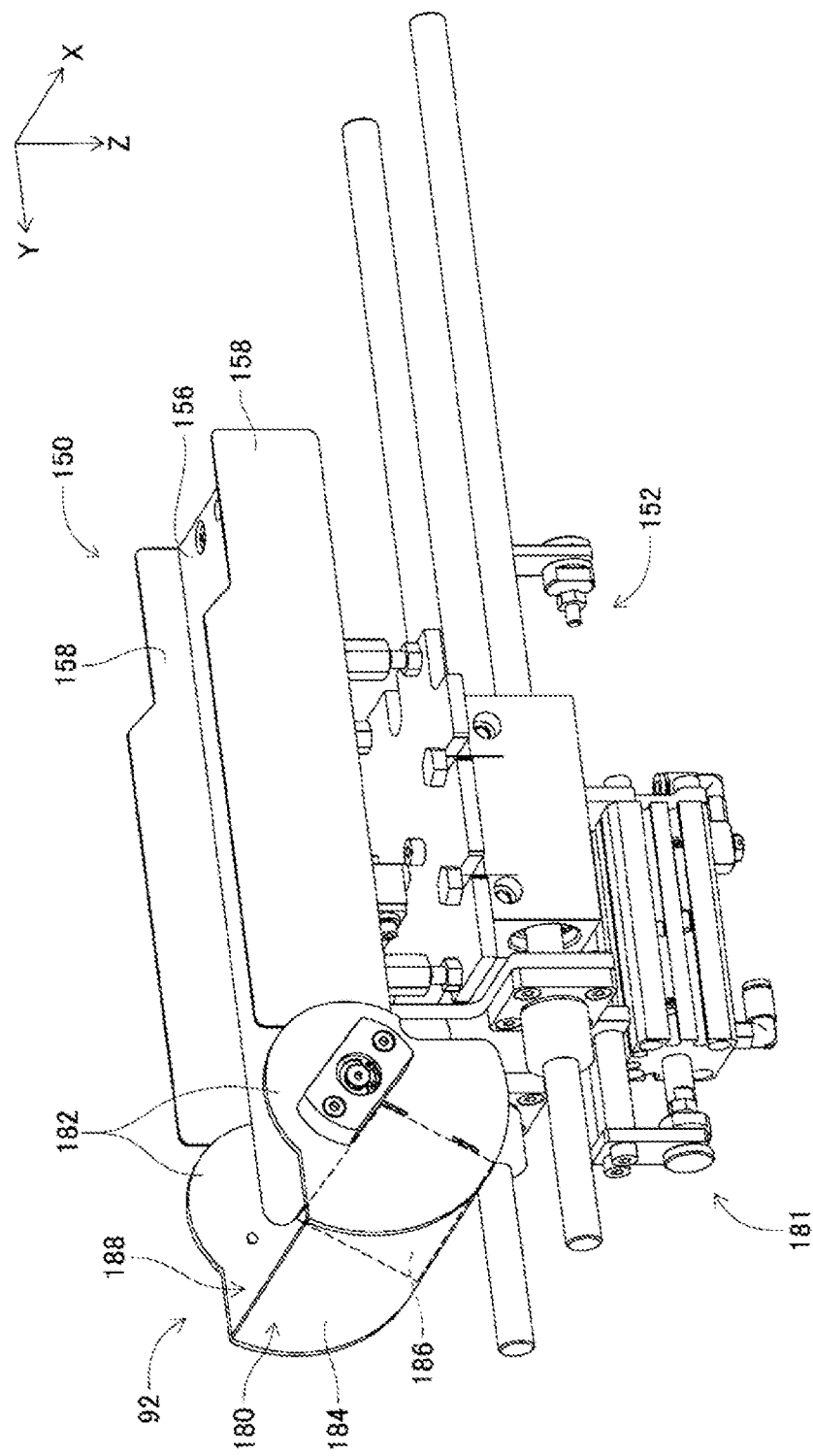
FIG. 7 is a perspective view of a component scattering device.
Figure 8:
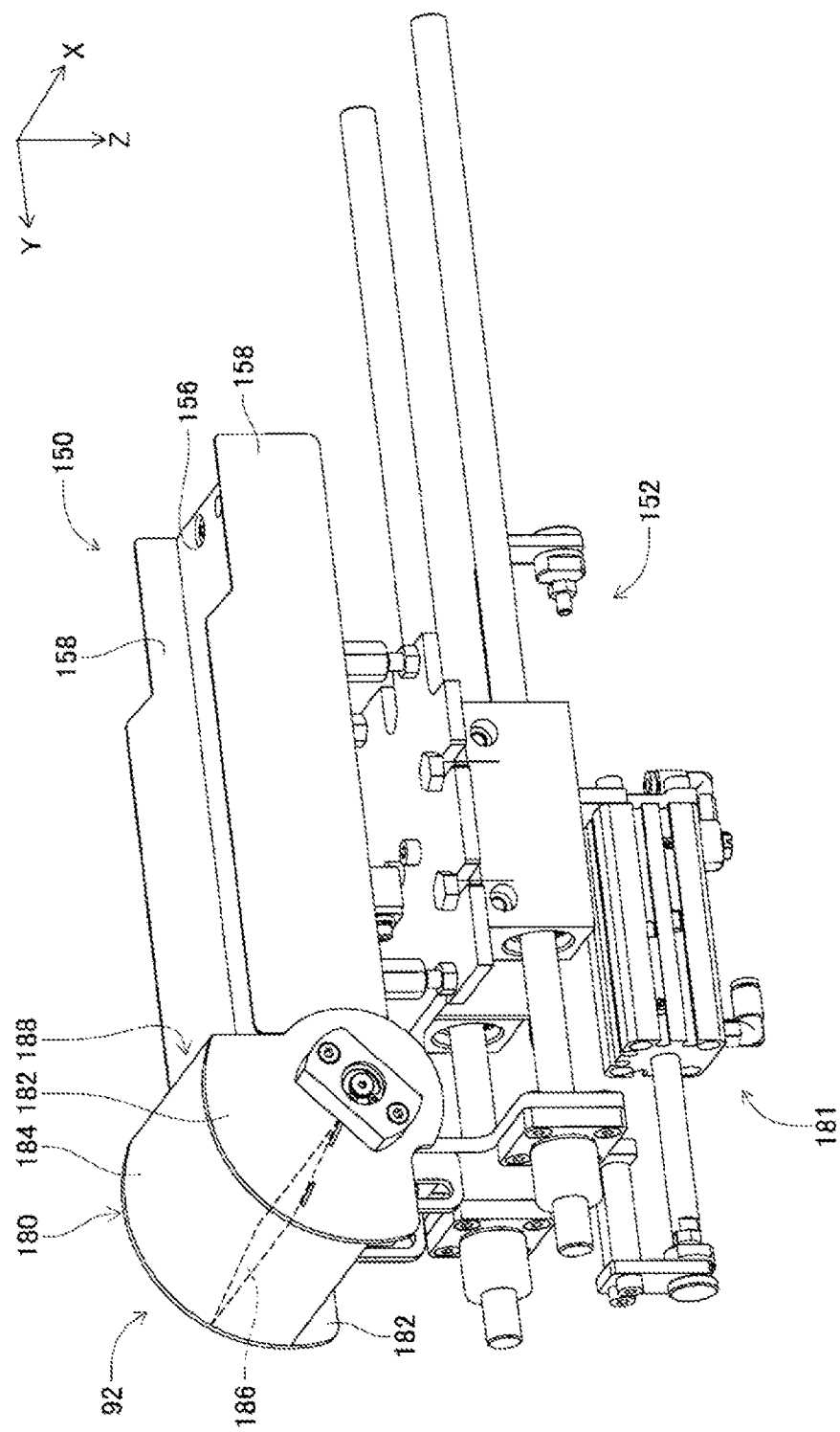
FIG. 8 is a perspective view of a component scattering device.

As shown in FIG. 7, component returning device 92 includes component collection container 180 and container swinging device 181. As shown in FIGS. 7 and 8, component collection container 180 is configured from pair of side walls 182, curved surface 184, and divider 186. Each of the pair of side walls 182 is roughly fan-shaped with the outer edge forming an arc. Curved surface 184 that is one of the walls of the box member is curved along the arc-shaped outer edge of wide wall 182, with the outer edges of the pair of side walls 182 fixed to the curved outer edges of curved wall 184. Further, divider 186 is a plate provided at a central portion in the bending direction of curved surface 184 in a state sandwiched between the pair of side walls 182. Thus, the inside of component collection container 180 is demarcated by the pair of side walls 182 and curved surface 184 and is divided by divider 186.

The distance between the pair of side walls 182 is slightly larger than the widthwise (X direction) dimension of stage 156 of component support member 150, and the front end of stage 156 is sandwiched by the pair of side walls 182. Also, component collection container 180 is supported at the front end of stage 156 to the pair of side walls 182 in a swingable manner. Further, component collection container 180 swings by the operation of container swinging device 181. Here, component storage container 180 is swung between a collection orientation (refer to FIG. 7) with opening 188 facing up, and a return orientation (refer to FIG. 8) with opening 188 facing the upper surface of stage 156 of component support member 150. Note that, when component collection container 180 is in the collection orientation, an upper end section of curved surface 184 extends above the upper surface of stage 156.

(b) Imaging Device

As shown in FIG. 3, imaging device 84 includes camera 290 and camera moving device 292. Camera moving device 292 includes guide rail 296 and slider 298. Guide rail 296 is fixed to main body 80 above component supply apparatus 88 so as to extend in the width direction (X direction) of loose component supply device 32. Slider 298 is slidably attached to guide rail 296, and can be slid to any position by operation of electromagnetic motor 299 (refer to FIG. 11). Also, camera 290 is attached to slider 298 facing downwards.

(c) Component Transfer Device

As shown in FIG. 3, component transfer device 86 includes component holding head moving device 300, component holding head 302, and two shuttle devices 304.

Component holding head moving device 300 includes X-direction moving device 310, Y-direction moving device 312, and Z-direction moving device 314. Y-direction moving device 312 includes Y slider 316 provided above component supply unit 82 and extending in the X direction, and Y slider 316 is moved to any position in the Y direction by operation of electromagnetic motor 319 (refer to FIG. 11). X-direction moving device 310 includes X slider 320 provided on a side surface of Y slider 316, and X slider 320 is moved to any position in the X direction by operation of electromagnetic motor 321 (refer to FIG. 11). Z-direction moving device 314 includes Z slider 322 provided on a side surface of X slider 320, and Z slider 322 is moved to any position in the Z direction by operation of electromagnetic motor 323 (refer to FIG. 11).

Figure 9:
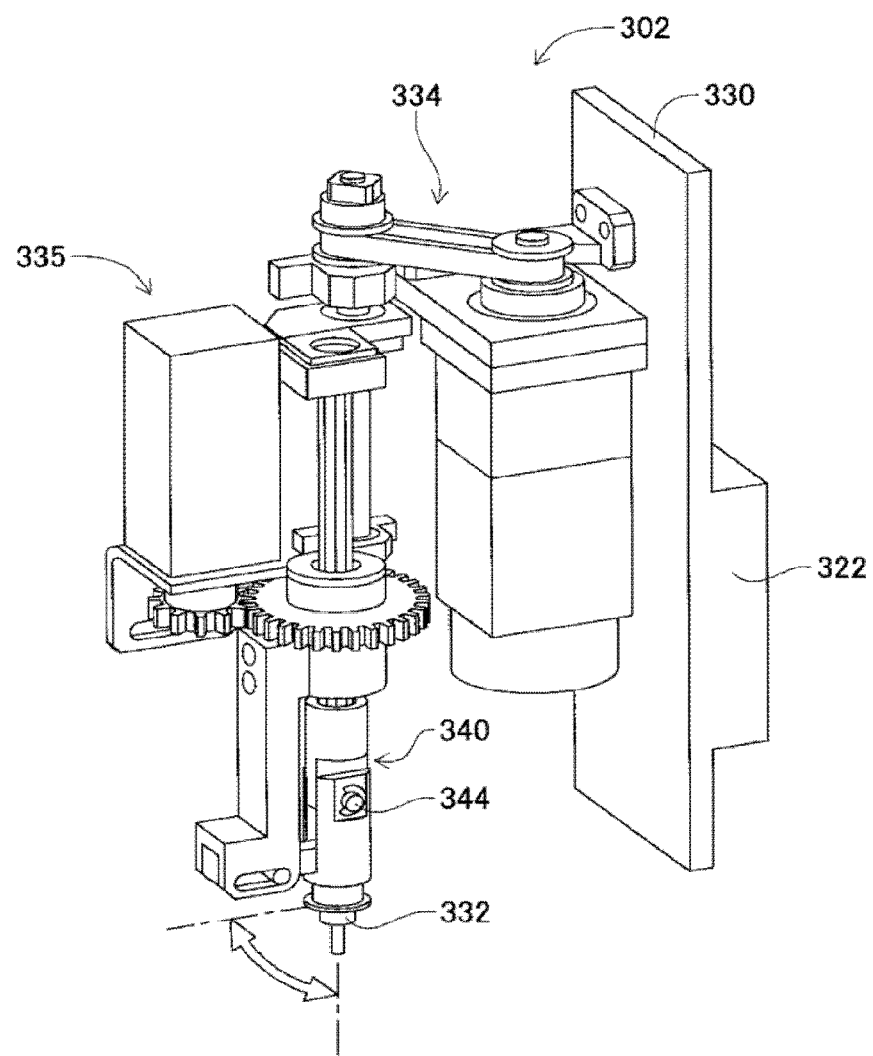
FIG. 9 is a perspective view of a component holding head.

As shown in FIG. 9, component holding head 302 includes head main body 330, suction nozzle 332, nozzle pivoting device 334, and nozzle rotating device 335. Head main body 330 is formed as one body with Z slider 322. Suction nozzle 332 is for holding a component, and is detachably attached to a lower end section of holder 340. Holder 340 is able to bend at support shaft 344, and holder 340 bends 90 degrees in an up direction by operation of nozzle pivoting device 334. By this, suction nozzle 332 attached to the bottom end of holder 340 is pivoted 90 degrees to be positioned at the pivoted position. That is, suction nozzle 332 is able to be pivoted to and from a non-pivoted position and a pivoted position by operation of nozzle pivoting device 334. Of course, it is also possible to stop the positioning at an angle between the non-pivoted position and the pivoted position. Further, nozzle rotating device 335 rotates suction nozzle 332 around its own center axis.

Further, as shown in FIG. 3, each of the two shuttle devices 304 includes component carrier 388, and component carrier moving device 390, and is fixed to main body 80 lined up in the sideways direction on the front side of component supply unit 82. Five component receiving members 392 are attached to component carrier 388 lined up in a single row sideways, and components are loaded on each component receiving member 392.

Figure 10:
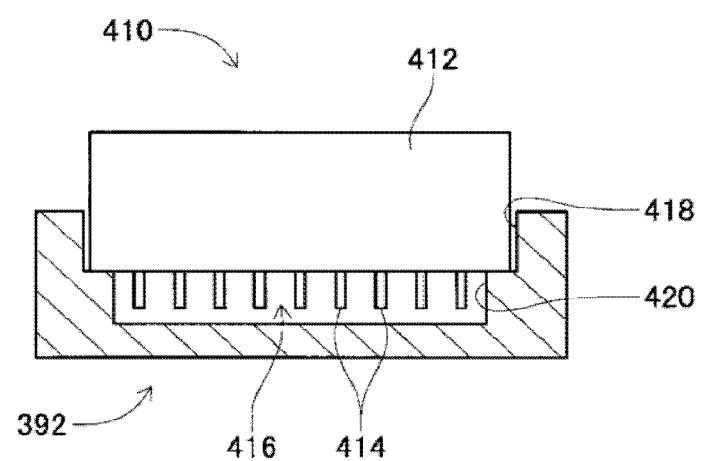
FIG. 10 shows a component receiving member in which is stored an electronic component.

Note that, loose component supply device 32 can be supplied with various components, and various forms of component receiving members 392 are prepared according to the shapes of the components. Here, regarding the component supplied by loose component supply device 32, a component receiving member 392 corresponding to leaded electronic component 410 as shown in FIG. 10 will be described. Electronic component 410 is composed of a block-shaped component main body 412 and multiple leads 414 projecting from the bottom surface of component main body 412.

Component receiving member 392 is formed with component reception recess 416 shaped according to electronic component 410. Component reception recess 416 is a stepped recess configured from main body section reception recess 418 open at the top surface of component receiving member 392, and lead reception recess 420 open at the bottom surface of main body section reception recess 418. Further, electronic component 410 is inserted into the component reception recess 416 with leads 414 facing downward. Therefore, leaded component 410 is loaded inside component reception recess 416 with leads 414 inserted into lead reception recess 420 and component main body 412 inserted into main body section reception recess 418.

Also, as shown in FIG. 3, component carrier moving device 390 is a long plate member provided on the front side of component supply unit 82 and extending in the front-rear direction. Component carrier 388 is provided on the upper surface of component carrier moving device 390 to be slidable in the front-rear direction, and is slid to any position in the front-rear direction by operation of electromagnetic motor 430 (refer to FIG. 11). Note that, component carrier 388, when slid in a direction approaching component supply unit 82, is slid to a component receiving position that is positioned within the movement range of component holding head 302 by component holding head moving device 300. Conversely, when slid in a direction away from component supply unit 82, component carrier 388 is slid to a component supply position that is positioned within the movement range of work heads 60 and 62 by work head moving device 64.

Further, as shown in FIG. 11, control device 34 includes overall control device 450, multiple individual control devices (only one is shown in the FIG. 452, and image processing device 454. Overall control device 450 is configured mainly from a computer and is connected to board conveying and holding device 22, component mounting device 24, imaging device 26, imaging device 28, component supply device 30, and loose component supply device 32. Thus, overall control device 450 performs overall control of board conveying and holding device 22, component mounting device 24, imaging device 26, imaging device 28, component supply device 30, and loose component supply device 32. The multiple individual control devices 452 are configured mainly from a computer and are provided corresponding to board conveying and holding device 22, component mounting device 24, imaging device 26, imaging device 28, component supply device 30, and loose component supply device 32 (in the figure, only individual control device 452 corresponding to loose component supply device 32 is shown).

Individual control device 452 of loose component supply device 32 is connected to component scattering device 90, component returning device 92, camera moving device 292, component holding head moving device 300, component holding head 302, and shuttle device 304. Individual control device 452 of loose component supply device 32 controls component scattering device 90, component returning device 92, camera moving device 292, component holding head moving device 300, component holding head 302, and shuttle device 304. Also, image processing device 454 is connected to imaging device 84 and processes image data captured by imaging device 84. Image processing device 454 is connected to individual control device 452 of loose component supply device 32. By this, individual control device 452 of loose component supply device 32 acquires image data captured by imaging device 84.

(B) Component Mounter Operation

Component mounter 10, according to the above configuration, mounts components on circuit board 12 held by board conveying and holding device 22. Specifically, circuit board 12 is conveyed to a work position, and is fixedly held at that position by clamp device 52. Next, imaging device 26 moves above circuit board 12 and images circuit board 12. By this, information related to a holding position error of circuit board 12 is obtained. Also, component supply device 30 or loose component supply device 32 supplies components at a specified supply position. Component supply by loose component supply device 32 is described in detail later. One of the work heads 60 or 62 moves above the component supply position and holds a component using suction nozzle 66. Then, work head 60 or 62 holding the component moves above imaging device 28, and the component being held by suction nozzle 66 is imaged by imaging device 28. Accordingly, information related to an error of the holding position of the component is obtained. Next, work head 60 or 62 holding the component moves above circuit board 12, and mounts the held component on circuit board 12 after correcting for the error in the holding position of circuit board 12 and the error in the holding position of the component and so on.

(C) Loose Component Supply Device Operation (a) Supplying Electronic Components with Loose Component Supply Device With loose component supply device 32, electronic components 410 are inserted by an operator into insertion opening 97 of component supply apparatus 88, then, the inserted electronic components 410 are supplied in a state loaded on component receiving member 392 of component carrier 388 by operation of component supply unit 82 and component transfer device 86.

In detail, the operator inserts electronic components 410 via insertion opening 97 at the top of component supply apparatus 88. Here, component support member 150 is moved below component supply apparatus 88 by operation of component support member moving device 152 to be in a stored state (refer to FIG. 6). With component support member 150 in a stored state, component collection container 180 is positioned in front of component supply apparatus 88, and the opening of component collection container 180 is oriented facing up (collection orientation).

Electronic components 410 that enter via insertion opening 97 of component supply apparatus 88 are conveyed by conveyor belt 112 forwards and diagonally up. Then, electronic components 410 conveyed by conveyor belt 112 are discharged from discharge opening 98 on the front side of component supply apparatus 88 via inclined plates 126 and 128.

By this, electronic components 410 discharged from discharge opening 98 of component supply apparatus 88 are stored inside component storage container 180. Then, when a predetermined amount of electronic components 410 have been discharged from component supply apparatus 88, that is, when conveyor device 106 has been operated by a specified amount, conveyor device 106 is stopped. Next, component support member 150 is moved from the stored state towards the front by the operation of component support member moving device 152.

Also, when component support member 150 has been moved forward from the stored state by a specified amount, container swinging device 181 of component returning device 92 is operated and component collection container 180 is swung. Accordingly, the orientation of component collection container 180 is changed suddenly from an orientation with the opening of facing up (collection orientation) to an orientation with the opening facing stage 156 (returning orientation). In this case, electronic components 410 collected in component collection container 180 are discharged with strong force towards stage 156. As a result, electronic components 410 are scattered from component storage container 180 onto stage 156.

Continuing, when electronic components 410 are scattered from component supply apparatus 88 onto stage 156 of component support member 150, camera 290 of imaging device 84, by operation of camera moving device 292, moves above component support member 150 and images electronic components 410. Then, electronic components 410 scattered on the upper surface of component support member 150, based on the imaging data, are divided into electronic components that can be picked up by suction nozzle 332 (also referred to as "pickup target components") and electronic components that cannot be picked up by suction nozzle 332 (also referred to as "non-pickup target components").

The method for dividing into pickup target components and non-pickup target components will be described briefly: electronic components 410 with a surface, such as an uneven surface, that makes pickup difficult facing up, tilted electronic components 410, and the like are designated as non-pickup target components, and other electronic components 410 are designated as pickup target components. Based on the imaging data, information such as the position on component support member 150 and the orientation of electronic components 410 is obtained with regard to the electronic components 410 designated as pickup target components.

Then, based on the acquired position information of the pickup target components, component holding head 302 is moved above a pickup target component by operation of component holding head moving device 300 and the pickup target component is picked up using suction nozzle 332. Note that, when the pickup target component is picked up and held by suction nozzle 332, suction nozzle 332 is in the non-pivoted position.

Then, after holding electronic component 410 using suction nozzle 332, component holding head 302 is moved above component carrier 388. Here, component carrier 388 is moved to the component receiving position by operation of component carrier moving device 390. Also, when component holding head 302 is moved above component carrier 388, suction nozzle 332 is pivoted to the pivoted position. Note that, suction nozzle 332 is rotated by operation of nozzle rotating device 335 such that leads 414 of the electronic component 410 held by suction nozzle 332 that is in the pivoted position face downwards in a vertical direction.

When component holding head 302 is moved above component carrier 388, electronic component 410 in a state with leads 414 facing downwards in the vertical direction is inserted into component reception recess 416 of component reception member 392. By this, as shown in FIG. 10, electronic component 410 is loaded in component receiving member 392 with leads 414 facing vertically downwards.

Also, when electronic component 410 is loaded on component receiving member 392, component carrier 388 is moved to the component supply position by operation of component carrier moving device 390. With loose component supply device 32, because component carrier 388 moved to the component supply position is within the movement range of work heads 60 and 62, electronic components 410 are supplied at this position. In this manner, with loose component supply device 32, electronic components 410 are supplied with leads 414 pointing downwards, and with the upper surface that is opposite to the bottom surface to which leads 414 are connected facing upwards. Therefore, suction nozzle 66 of work head 60 or 62 is able to appropriately hold electronic component 410.

(b) Storage of Electronic Components in Component Collection Container and Scattering on Stage With loose component supply device 32, when pickup target components are scattered on stage 156 of component support member 150, pickup of the scattered pickup target components is repeated and the picked up pickup target components are loaded on component receiving member 392. Then, by component carrier 388 mounted on component receiving member 392 being moved to the component supply position, supply of electronic components 410 is performed.

However, if components to be picked up are not scattered on stage 156 of component support member 150, the electronic components 410 cannot be picked up from stage 156. That is, if all of the pickable electronic components 410 are picked up and only the non-pick-up target components remain on stage 156, electronic components 410 cannot be picked up from stage 156.

Thus, with loose component supply device 32, in such a case, electronic components 410 remaining on stage 156 are collected in component collection container 180. Then, the electronic components 410 collected in component collection container 180 are scattered over stage 156 again, and the orientation of the electronic components 410 is changed, whereby picking up of the electronic components 410 from stage 156 is resumed.

Specifically, when all the pickup target components on stage 156 have been picked up, component support member 150 moves toward the lower side of component supply apparatus 88 by the operation of component support member moving device 152. That is, component support member 150 is moved from the exposed state (refer to FIG. 5) towards the stored state (refer to FIG. 6). Here, component storage container 180 provided at the front end of component support member 150 at the side at which scattered electronic components 410 drop is oriented such that the opening that is the dropping opening to which electronic components 410 drop is facing up (collection orientation). Therefore, electronic components 410 on stage 156 of component support member 150 are stopped by the front end of inclined plate 128 of component supply apparatus 88 when component support member 150 moves from the exposed state to the stored state. In other words, electronic components 410 on stage 156 are contacted and caught by the front end of inclined plate 128 that functions as scraper 460 in accordance with the movement of stage 156.

Figure 6:
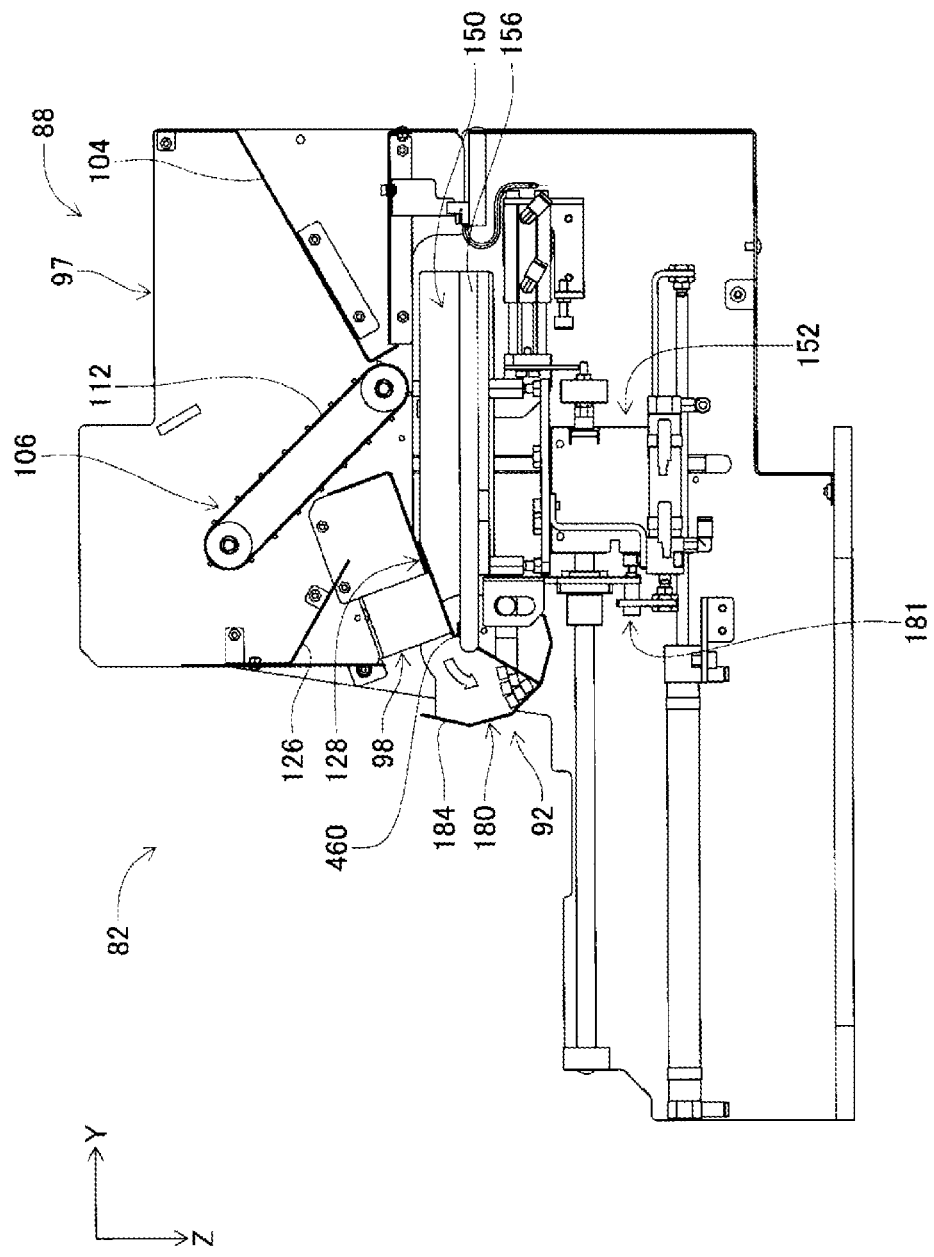
FIG. 6 is a transparent cross section view of the component supply unit.

Further, as shown in FIG. 6, when component support member 150 reaches the stored state, electronic components 410 on stage 156, by being caught by scraper 460, drop inside component storage container 180 via the dropping opening. By this, electronic components 410 remaining on stage 156 are collected in component collection container 180. In this manner, when electronic components 410 on stage 156 are collected in component collection container 180, the collected electronic components 410 are replenished on stage 156.

In detail, when collection of electronic components 410 into component collection container 180 is complete, as shown in FIG. 6, component support member 150 is in the stored state. Thus, component support member 150 is moved from the stored state towards the front by the operation of component support member moving device 152. Also, when component support member 150 has been moved forward from the stored state by a specified amount, container swinging device 181 of component returning device 92 is operated and component collection container 180 is swung.

Accordingly, the orientation of component collection container 180 is changed suddenly from an orientation with opening 188 facing up (collection orientation) to an orientation with opening 188 facing stage 156 (returning orientation). In this case, electronic components 410 collected in component collection container 180 are discharged with strong force towards stage 156. As a result, electronic components 410 are scattered from component storage container 180 onto stage 156. That is, electronic components 410 collected in component collection container 180 are scattered onto stage 156.

(c) Eliminating Clogging of Component During Component Collection

In the above manner, with loose component supply device 32, electronic components 410 on stage 156 are collected in component collection container 180, and the electronic components 410 collected in component collection container 180 are scattered on stage 156. This enables the changing of the orientation of the electronic components on stage 156 such that electronic components 410 can once again be picked up from stage 156.

Figure 12:
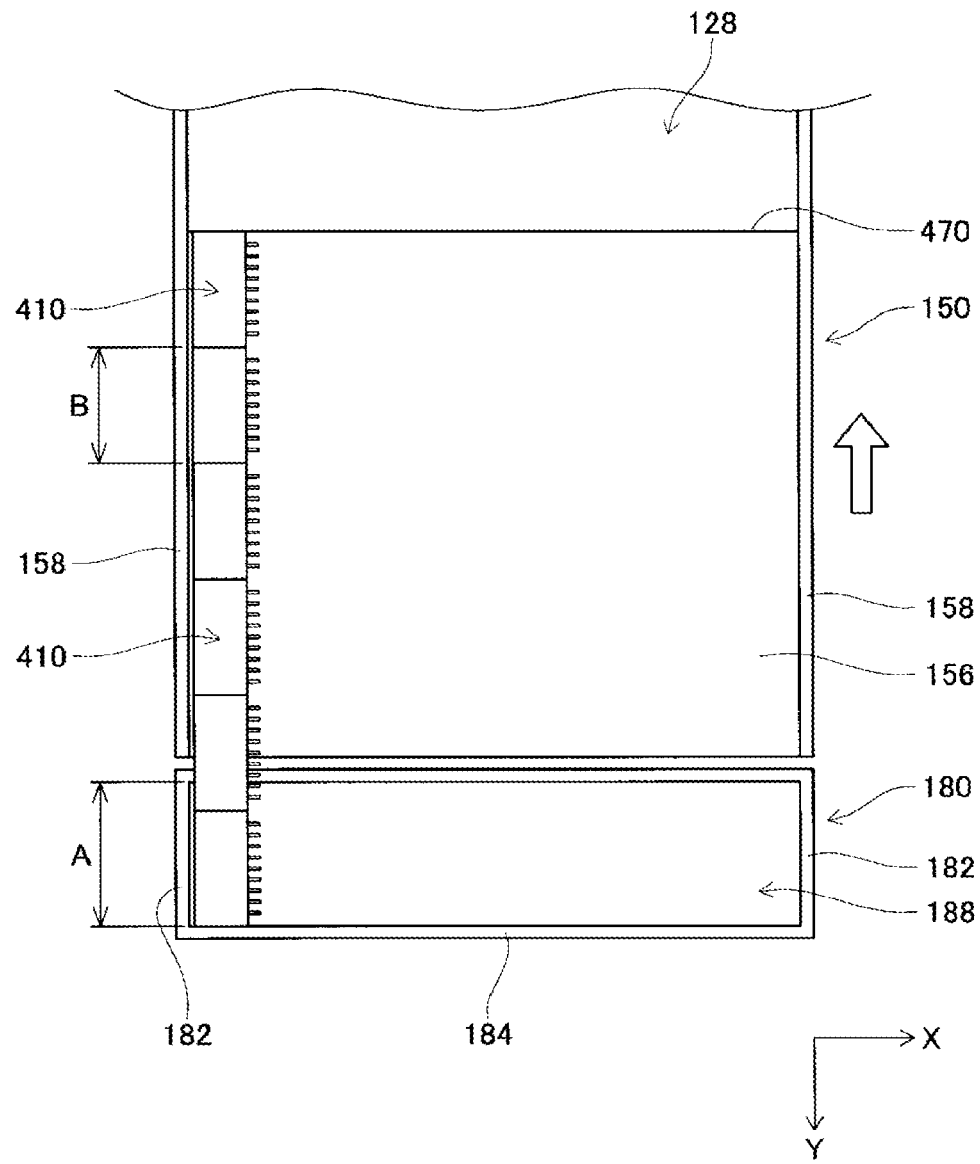
FIG. 12 is a schematic view showing a scraper and a stage in a state with a component blockage occurring.

However, when electronic components 410 on stage 156 are collected into component collection container 180, clogging of the electronic components 410 may occur and the electronic components 410 may not be appropriately collected into component collection container 180. Specifically, with a conventional loose component supply device, as shown in FIG. 12, the front end of inclined plate 128 that catches electronic components 410 on stage 156, that is, scraper 470, extends in a straight line in the X direction. In other words, it extends in a straight line along the upper surface of stage 156 with respect to the direction in which stage 156 slides (Y direction) during collection of electronic components 410.

Further, there are cases in which multiple electronic components 410 on stage 156 become arranged in a straight line in the sliding direction of component support member 150, that is, the Y direction. In such cases, when component support member 150 slides toward the stored state, as shown in FIG. 12, the multiple electronic components 410 may become sandwiched between scraper 470 and curved surface 184 of component collection container 180 that functions as a wall on the opposite side to the side at which electronic components 410 drop. In particular, electronic components 410 may become clogged in a straight line along side wall 158 if there are many components scattered close to side wall 158, that is, the edge section in the X direction on stage 156.

Further, with loose component supply device 32, relatively large components are supplied. Specifically, for example, there are cases in which electronic components 410 with a maximum dimension B of 30 mm are supplied. On the other hand, the size of component collection container 180 is relatively compact in consideration of the limited arrangement space of the overall device. Thus, with loose component supply device 32, the distance between curved surface 184 and the front edge of the opening of component collection container 180 at which electronic components 410 drop (referred to as "opening dimension) is A, which is 40 mm. That is, with loose component supply device 32, opening dimension A (=40 mm) is at least 1.2 times maximum dimension B (=30 mm) of electronic component 410. Note that, strictly speaking, opening dimension (=40 mm) is at least 1.3 times maximum dimension B (=30 mm), but considering tolerances and the like, opening dimension A is considered to be at least 1.2 times maximum dimension B.

In this manner, with an opening dimension A less than 1.2 times maximum dimension B of electronic component 410, before electronic components 410 drop into component collection container 180, multiple electronic components 410 may get sandwiched between scraper 470 and curved surface 184 of component collection container 180 that functions as a wall on the opposite side to the side at which electronic components 410 drop. Note that, so long as opening dimension A of component collection container 180 is at least 1.0 times maximum dimension B of electronic component 410, it is physically possible for electronic component 410 to be collected in component collection container 180. However, to enable this, it is necessary to make the movement speed of component support member 150 extremely slow, which means collection work of electronic components 410 takes a long time. Thus, considering a need to perform collection work of electronic components 410 within allocated processing time, with an opening dimension of component collection container less than 1.2 times maximum dimension B of electronic component 410, even with braking control technology, it is hard to satisfy needs. On the other hand, considering the need to make component collection container 180 compact, it is desirable that opening dimension A of component collection container 180 is from 1.5 to 2.0 times maximum dimension B of electronic component 410.

Also, when electronic components 410 are collected in component collection container 180, if they gather close to side wall 182 of component collection container 180, they may become clogged even with small dimensions. Specifically, for example, if many electronic components 410 are scattered on stage 156 close to side wall 158, electronic components 410 collected in component collection container 180 gather close to side wall 182. In this manner, if electronic components 410 are gathered close to side wall 182 of component collection container 180, electronic components accumulate along side wall 182 of component collection container 180. Here, there are cases in which electronic components 410 accumulate all the way close to opening 188 of component collection container 180. In such a case, electronic components 410 that have accumulated in component collection container 180 and electronic components 410 that are just about to drop from stage 156 into component collection container 180 contact each other, such that, at the contact point, electronic components 410 on stage 156 stop, which causes clogging.

Figure 13:
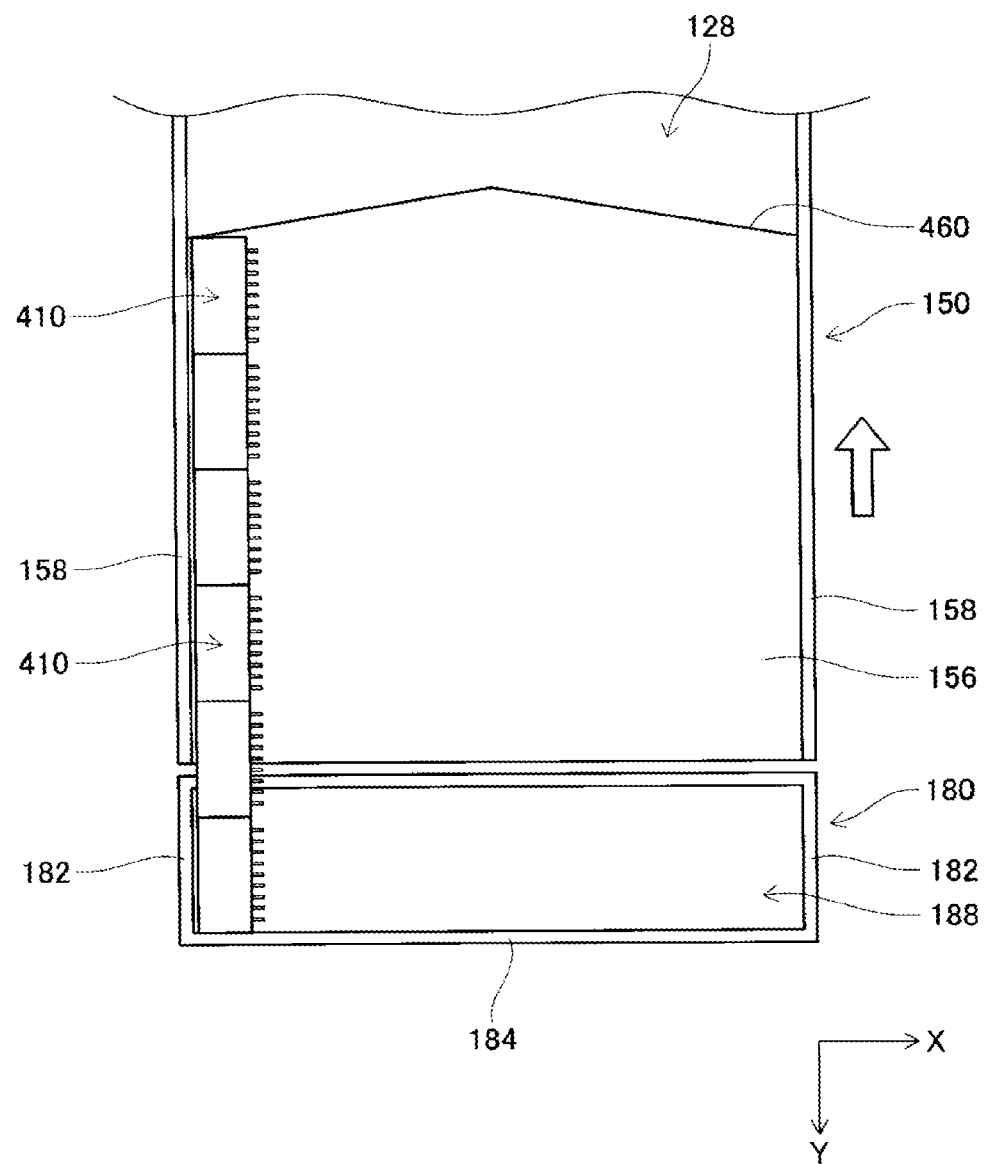
FIG. 13 is a schematic view showing a scraper and a stage of an embodiment capable of releasing the component blockage.

Considering this, with loose component supply device 32, as shown in FIG. 13, the front end section of inclined plate 128 that catches electronic components 410 on stage 156, that is, scraper 460, is arranged extending in the X direction and inclined with respect to the X direction. In other words, scraper 460 extends in a straight line along the upper surface of stage 156 inclined with respect to the direction in which stage 156 slides (Y direction) during collection of electronic components 410.

In detail, scraper 460, overall its entire length, is inclined such that a center section of scraper 460 is further away from component collection container 180 than both edge sections of scraper 460. That is, scraper 460 is bent into a V-shape, with the tip of the bent section extending in the sliding direction of stage 156 during collection of electronic components 410. To put it another way, scraper 460 is inclined to be concave inwards towards the center in the sliding direction of stage 156. Note that, the inclination angle of scraper 460 is approximately 5 degrees with respect to the X direction.

Figure 14:
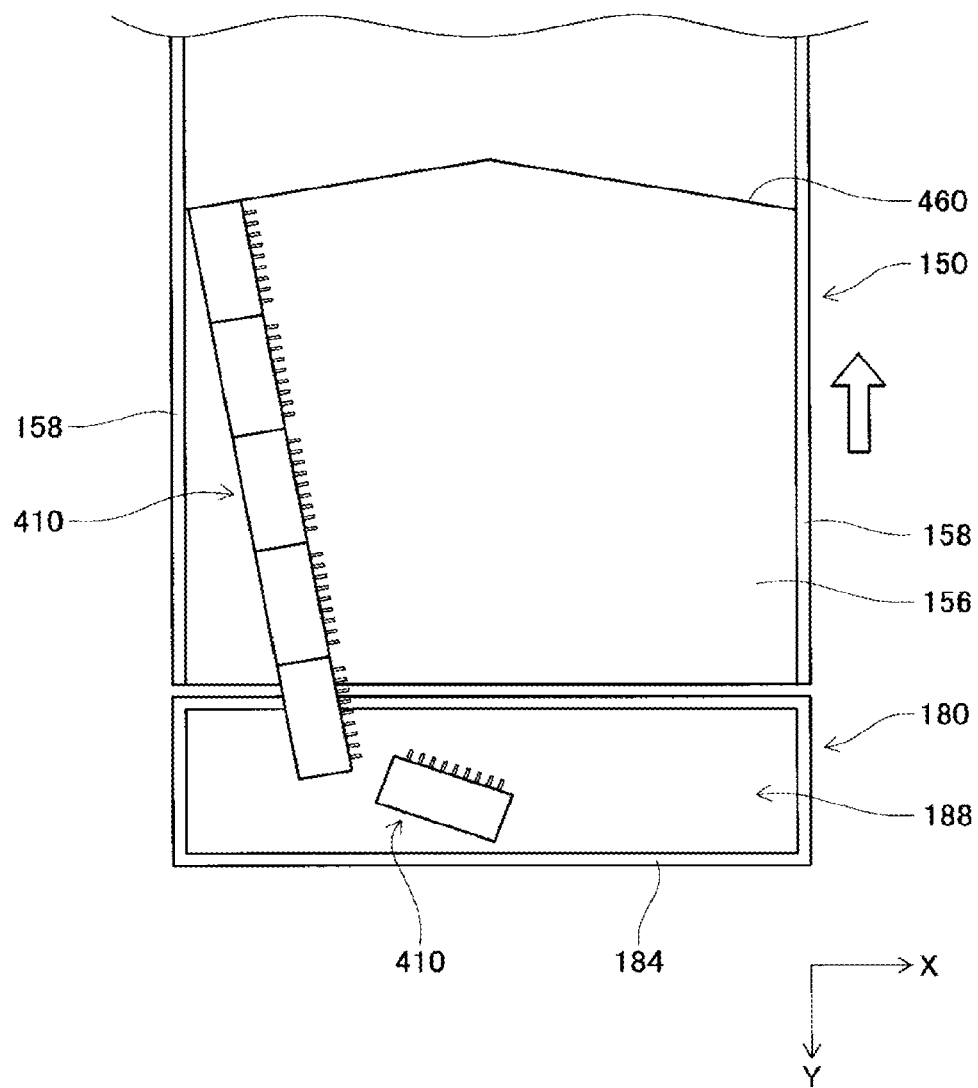
FIG. 14 is a schematic view showing a scraper and a stage of an embodiment capable of releasing the component blockage.

In this manner, by inclining scraper 460 at an angle, when electronic components 410 on stage 156 are contacted by scraper 460 in accordance with the sliding of stage 156, the force imparted on the electronic components is in a direction inclined with respect to the sliding direction of component support member 150. Thus, for example, if multiple electronic components 410 are lined up in a straight line in the sliding direction of stage 156, when the electronic components 410 are contacted by scraper 460, as shown in FIG. 14, the multiple electronic components 410 become lined up in a direction inclined with respect to the sliding direction of component support member 150. Here, among the lined up multiple electronic components 410, the electronic component 410 furthest to the front contacts curved surface 184 of component collection container 180 in an inclined state. Thus, the lined up multiple electronic components 410 drop into component collection container 180, which is furthest to the front, without being sandwiched between scraper 460 and curved surface 184.

Figure 15:
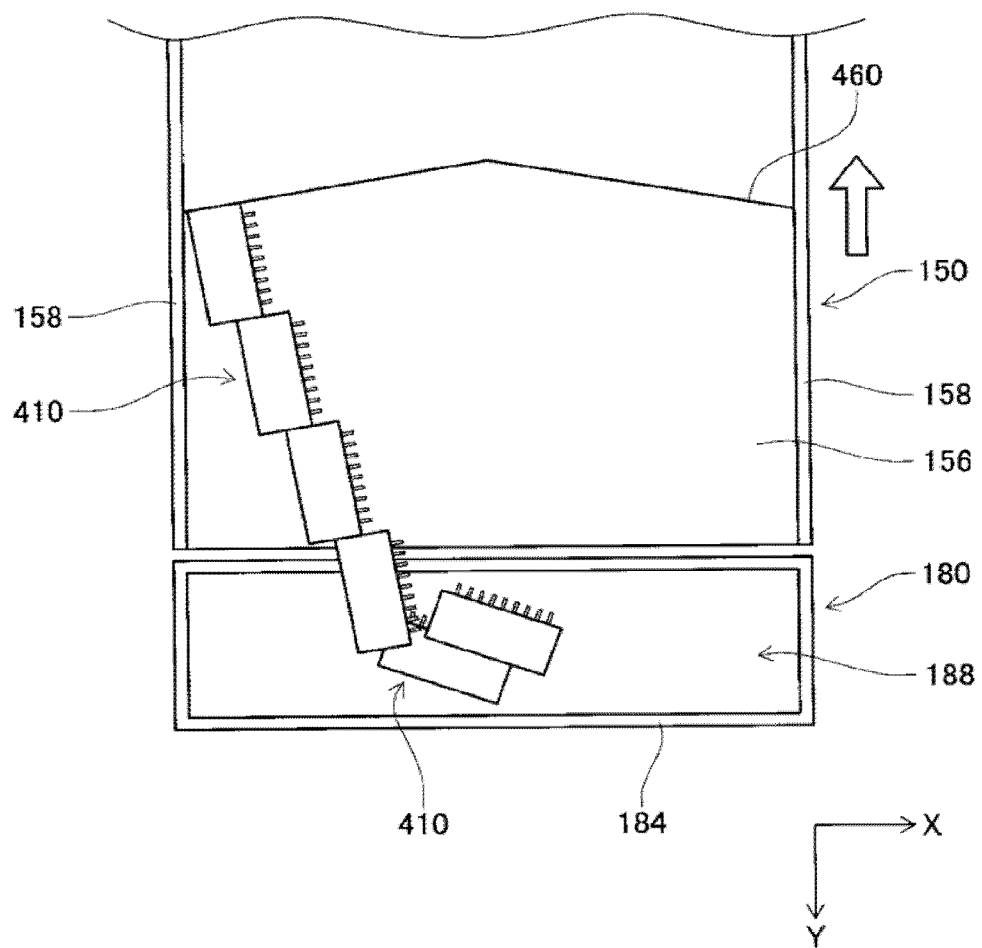
FIG. 15 is a schematic view showing a scraper and a stage of an embodiment capable of releasing the component blockage.

Continuing, stage 156, by sliding further towards scraper 460, as shown in FIG. 15, makes the lined up multiple electronic components 410 shift in turn in the direction perpendicular to the sliding direction of stage 156. Thus, in this manner, the multiple electronic components 410, by being shifted in the direction perpendicular to the sliding direction of stage 156, are prevented from becoming clogged by being sandwiched between scraper 460 and curved surface 184 in a state lined up in a straight line. By this, it is possible to favorably collect electronic components with maximum dimension B of 30 mm in component collection container 180 with an opening dimension A of 40 mm.

Further, scraper 460 is bent into a V-shape, that is, inclined to be concave inwards towards the center in the sliding direction of stage 156. In this manner, by inclining scraper 460 at an angle, the force imparted on electronic components 410 from scraper 460 in accordance with the sliding of stage 156 is in a direction towards the center with respect to the X direction of stage 156. Thus, if the multiple electronic components 410 on stage 156 are lined up in a straight line along side wall 158 (see FIG. 13), when the electronic components 410 are caught by scraper 460, as shown in FIG. 14, the multiple electronic components 410 are separated from side wall 158. Further, the electronic components 410 caught by scraper 460 are pushed by scraper 460 towards the center of state 156 in the X direction.

In this manner, electronic components 410 pushed towards the center of stage 156 in the X direction, as shown in FIG. 15, drop to a center section of component collection container 180 in the X direction in accordance with the sliding of stage 156. That is, the multiple electronic components 410 on stage 156 lined up in a straight line along side wall 158 are caught by scraper 460 that is bent into a V-shape so as to drop to a center section of component collection container 180 in the X direction. Here, even if the multiple electronic components 410 accumulate in a center section of component collection container 180 in the X direction, the accumulated multiple electronic components 410 are separated from side walls 182 and thus fall easily in the left-right direction. Thus, the multiple electronic components 410 do not accumulate easily, meaning that it is unlikely that accumulated electronic components 410 will reach close to opening 188 of component collection container 180. Thus, electronic components 410 that have accumulated in component collection container 180 and electronic components 410 that are just about to drop from stage 156 into component collection container 180 are less likely to contact each other, and it is possible to prevent electronic components 410 on stage 156 stopping and causing clogging.

Note that, loose component supply device 32 is an example of a component supply device. Component support member moving device 152 is an example of a slide device. Stage 156 is an example of a stage. Component collection container 180 is an example of a box member. Curved surface 184 is an example of a wall. Opening 188 is an example of a dripping opening. Scraper 460 is an example of a contacting section.

Figure 16:
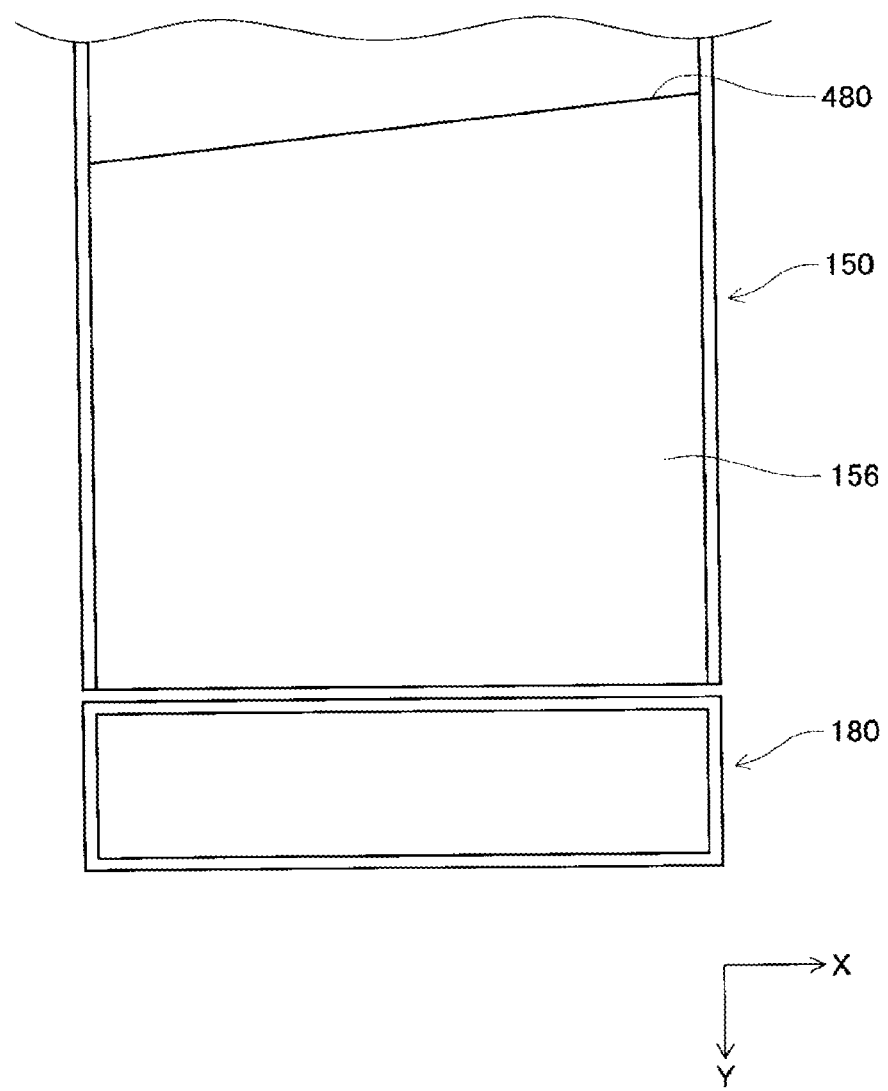
FIG. 16 is a schematic view showing a scraper and a stage of an alternative embodiment capable of releasing the component blockage.

Further, the present disclosure is not limited to the above example embodiments, and various changed or improved methods of embodiment are possible based on the knowledge of someone skilled in the art. Specifically, for example, in an embodiment above, scraper 460 that is bent into a V-shape is used, but, as shown in FIG. 16, scraper 480 arranged extending in a straight line in a direction crossing the sliding direction (Y direction) of stage 156 without being bent may be employed. Such a scraper 480 may be inclined with respect to a direction in which stage 156 slides (Y direction) and a direction in a straight line along the upper surface of stage 156.

Figure 17:
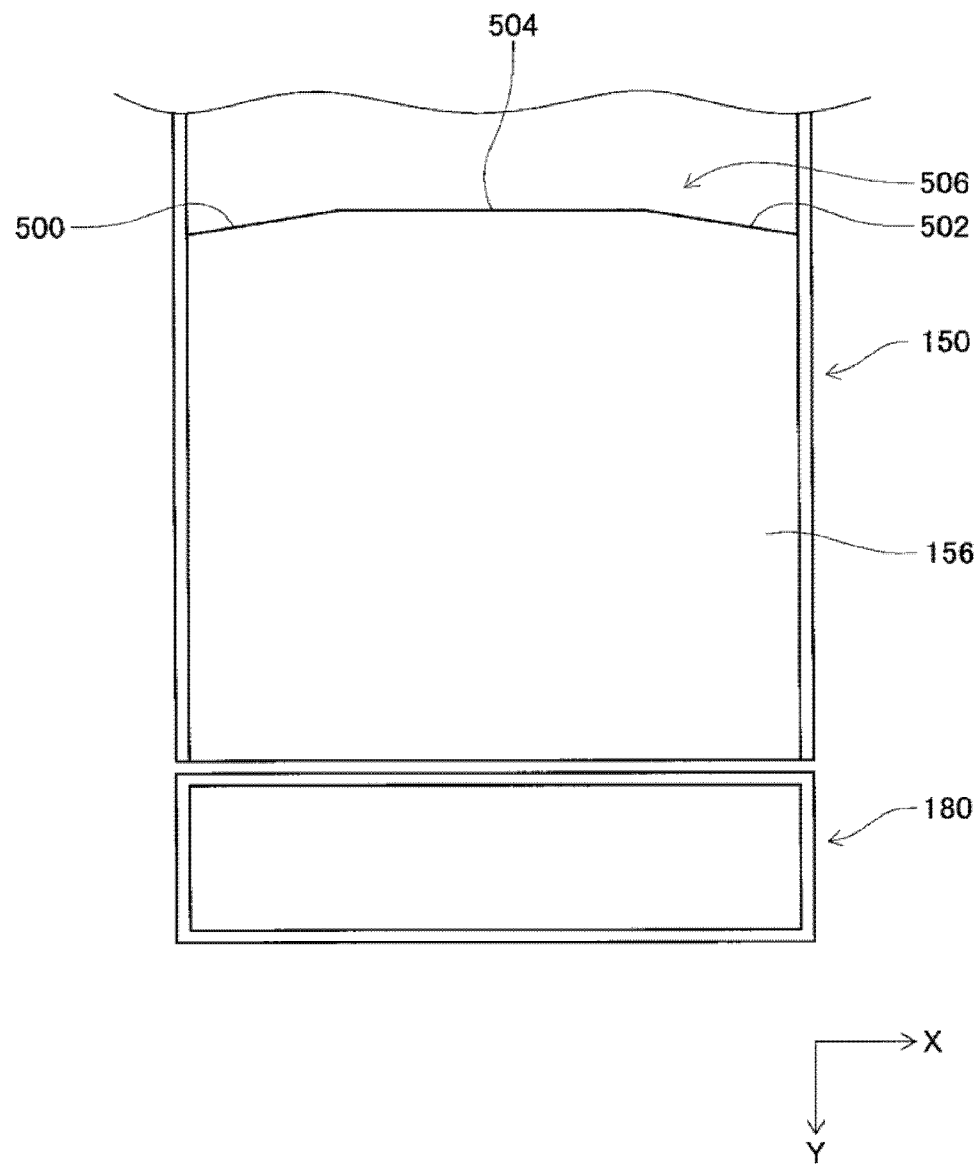
FIG. 17 is a schematic view showing a scraper and a stage of an alternative embodiment capable of releasing the component blockage.

Further, although the above scrapers 460 and 480 are inclined over their entire lengths, a scraper that is only inclined over a portion of its length may be used. Specifically, for example, as shown in FIG. 17, scraper 506 configured from pair of inclined sections 500 and 502 and non-inclined section 504 may be used. The pair of inclined sections 500 and 502 are inclined with respect to a direction in which stage 156 slides (Y direction) and a direction in a straight line along the upper surface of stage 156, and are positioned at the edges of scraper 506 in the X direction. Note that, the pair of inclined sections 500 and 502 are inclined from the edges of scraper 506 to a center section such that the center section is further from component collection container 180. Further, non-inclined section 504 is straight with respect to the sliding direction of stage 156 (Y direction) and a direction along the upper surface of stage 156, and connects the pair of inclined sections 500 and 502 by being positioned in the center of them in the X direction of scraper 506. By using such a scraper 506, it is possible to realize similar effects to those obtained by scraper 460. Note that, scrapers 460, 480, and 506 had straight line inclined sections, but the inclined sections may be curved, arc-shaped, or the like. To put it another way, an opposite shape to the above, in detail, a shape such that a portion of or the entire scraper 460 is an inverse V-shape or an inverse arc may be used, which would also make it possible to catch the lined up multiple electronic components 410 and shift them in a direction perpendicular to the sliding direction of stage 156. By this, it is possible to achieve a similar effect of preventing electronic components 410 becoming sandwiched between scraper 460 and curved surface 184.

Further, in an embodiment above, electronic components 410 on stage 156 are collected in component collection container 180 by component support member 150 being slid, but electronic components 410 on stage 156 may be collected in component collection container 180 by scraper 460 being slid. Further, electronic components 410 on stage 156 may be collected in component collection container 180 by component support member 150 and scraper 460 being brought closer to each other.

Further, in an embodiment above, opening dimension A of component collection container 180 is at least 1.2 times maximum dimension B of electronic component 410, but by slowing to a certain extent the movement speed of component support member 150, opening dimension A of component collection container 180 may be less than 1.2 times maximum dimension B of electronic component 410. Specifically, for example, opening dimension A of component collection container 180 may be at least 1.1 times maximum dimension B of electronic component 410.

Further, curved surface 184 of component collection container 180 that functions as a wall on the opposite to the side at which electronic components 410 drop does not have to be a curved surface, which is a shape employed to prevent damage or breakage due to a load imparted on electronic components 410 when the electronic components 410 are collected into component collection container 180 or when the electronic components 410 are scattered from component collection container 180.

Also, in an embodiment above, the present disclosure is applied to electronic components 410 such as components with leads, but the present disclosure may be applied to various types of components. Specifically, for example, the present disclosure may be applied to configuration components of solar panels, configuration components of power modules, electronic components without leads, and so on.

REFERENCE SIGNS LIST

32: loose component supply device (component supply device);
152: component support member moving device (slide device);
156: stage;
180: component collection container (box member);
184: curved surface (wall);
188: opening (dropping opening);
460: scraper (contacting section);
480: scraper (contacting section);
506: scraper (contacting section)

The invention claimed is:
1. A component supply device comprising:
a component supply apparatus including a box which contains electronic components, the component supply apparatus including a component insertion opening at an upper surface of the component supply apparatus and a component discharge opening at a front surface of the component supply apparatus;

a horizontal stage configured such that electronic components contained in the box are scattered on the horizontal stage, the horizontal stage being disposed horizontally below the component discharge opening;

a contacting section provided at a front end section of the box, the contacting section provided at a height so as to contact the electronic components on the horizontal stage;

a slide device configured to slide the horizontal stage relative to the contacting section in a sliding direction parallel to a front-rear direction of component supply apparatus;

a dropping opening configured to allow the electronic components scattered on the horizontal stage that have been caught by the contacting section to drop in accordance with movement of the horizontal stage by the slide device relative to the contacting section; and a wall higher than the horizontal stage provided at a side opposite to a side of the dropping opening at which the electronic components scattered on the horizontal stage drop, wherein the contacting section is provided to extend in a direction perpendicular to the sliding direction by the slide device, and at least a portion of the contacting section is inclined with respect to a straight direction along the sliding direction and an upper surface of the horizontal stage.

2. The component supply device according to claim 1, wherein
the contacting section is inclined such that a center section of the contacting section is further away from the dropping opening than both edge sections of the contacting section.

3. The component supply device according to claim 1, wherein
a distance between the wall and an edge section of the dropping opening on a side at which the electronic components scattered on the horizontal stage drop is at least 1.2 times a maximum dimension of the electronic component.

4. The component supply device according to claim 1, wherein
the box is a box member that is open at a top surface, wherein the top surface opening of the box member functions as the dropping opening, and a side surface of the box member functions as the wall.

5. The component supply device according to claim 1, further comprising:
a first inclined plate provided below the component insertion opening, the first inclined plate being inclined so as to incline downward from a rear end surface of the component supply apparatus toward a center of the component supply apparatus;
a conveyor device arranged on a front side of the first inclined plate; and
a second inclined plate arranged below a front end of the conveyor device, the second inclined plate being inclined such that a front end of the conveyor device is positioned downward from below a central portion of the conveyor device toward the component discharge opening.

6. The component supply device according to claim 5, wherein
the conveyor device is arranged to be inclined upward from a front side end of the first inclined plate toward the front surface of the component supply apparatus.

7. The component supply device according to claim 1, wherein
the slide device is configured to slide the horizontal stage between a stored state of the component supply device and an exposed state of the component supply device, a front end of the horizontal stage being closer to the component discharge opening in the stored state than in the exposed state.

* * * * *